(12) United States Patent
Pulugurtha et al.

(10) Patent No.: US 7,977,758 B2
(45) Date of Patent: Jul. 12, 2011

(54) FERROELECTRICS AND FERROMAGNETICS FOR NOISE ISOLATION IN INTEGRATED CIRCUITS, PACKAGING, AND SYSTEM ARCHITECTURES

(75) Inventors: Markondeya Raj Pulugurtha, Atlanta, GA (US); Madhaven Swaminathan, Marietta, GA (US); Mahadevan Krishna Iyer, Marietta, GA (US); Rao Tummala, Stone Mountain, GA (US); Isaac Robin Abothu, Atlanta, GA (US); Jin Hyun Hwang, Dunwoody, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 133 days.

(21) Appl. No.: 12/214,696

(22) Filed: Jun. 20, 2008

(65) Prior Publication Data
US 2010/0103639 A1    Apr. 29, 2010

Related U.S. Application Data

(60) Provisional application No. 60/945,166, filed on Jun. 20, 2007.

(51) Int. Cl.
*H01L 29/82* (2006.01)
(52) U.S. Cl. ........ 257/421; 257/422; 257/428; 257/435; 361/818
(58) Field of Classification Search .................. 257/421, 257/422, 428, 435; 361/818
See application file for complete search history.

(56) References Cited

U.S. PATENT DOCUMENTS

| 7,215,301 | B2 | 5/2007 | Choi et al. | |
| 2001/0048303 | A1* | 12/2001 | Hachisuka et al. | 324/210 |
| 2004/0202797 | A1* | 10/2004 | Ginder et al. | 427/598 |
| 2005/0045998 | A1* | 3/2005 | Kools et al. | 257/659 |
| 2006/0100336 | A1* | 5/2006 | Fukui | 524/430 |
| 2007/0103814 | A1* | 5/2007 | Yamanaka et al. | 360/128 |

OTHER PUBLICATIONS

Charles E. Kittel, Theory of ferromagnetic resonance absorption, vol. 73, 2, Jan 1948, pp. 155-161.
Ki Hyeon Kim, et al., "Integrated Noise Suppressor Using Soft Magnetic Films," IEEE Transactions on Magnetics vol. 40, No. 4, Jul. 2004.
Bijoy Kuanr, et al., "Iron and Permalloy based magnetic monolithic tunable microwave devices," Journal of Applied Physics, vol. 93, No. 10, May 15, 2003.
Leszek M. Malkinski, et al., "Microwave Absorption of Patterned Arrays of Nanosized Magnetic Stripes with Different Aspect Ratios," Journal of Applied Physics, 101, 2007.

* cited by examiner

*Primary Examiner* — Tan N Tran
(74) *Attorney, Agent, or Firm* — Ryan A. Schneider; Dustin B. Weeks; Troutman Sanders LLP

(57) ABSTRACT

Disclosed are ferroelectric and ferromagnetic noise isolation structures that reduce electromagnetic interference and noise in integrated circuit devices and system architectures. Representative structures comprise two or more devices that are vertically disposed relative to one another, and a thin ferroelectric or ferromagnetic film layer disposed between the respective devices that isolates electromagnetic energy coupling from one device to another.

15 Claims, 3 Drawing Sheets

FERROELECTRICS AND FERROMAGNETICS FOR NOISE ISOLATION IN INTEGRATED CIRCUITS, PACKAGING, AND SYSTEM ARCHITECTURES

This application claims the benefit of U.S. Provisional Application No. 60/945,166, filed Jun. 20, 2007.

BACKGROUND

The present invention relates to noise isolation structures, and more particularly, to ferroelectric and ferromagnetic noise isolation structures, devices and system architectures.

System miniaturization and high performance (higher bandwidth, functionality and lower power requirements) demand integrated heterogeneous device architectures. Logic, memory and analog devices are continuously integrated with three-dimensional packaging. On the other hand, passive and active functions are migrating to wafer scale to integrate the digital and mixed signal subsystems in small form factors with leading edge performance. Three-dimensional integration with through-vias and wafer-to-wafer bonding, and embedded wafer level functions is evolving as a major paradigm shift to address system integration demands.

Noise isolation is a major concern for integrated mixed signal systems. High frequency digital signals induce noise into the sensitive low-power RF circuits. Integration of dissimilar signals requires large isolation between them. For multiple voltage levels, distributing power to the digital and RF circuits, while simultaneously maintaining isolation and low EMI, can be a major challenge. As systems migrate to three dimensional structures with smaller form factors, this problem is further aggravated.

Currently, noise isolation is achieved with RF chokes, EMI shields, ferrite absorbers, patterned ground planes creating electronic band gap (EBG) structures, and the like. These structures are limited by current material systems leading to bulky structures that cannot be easily integrated into thin film build-up structures and cannot isolate at higher frequencies. In addition, tunability is not easily achieved with the current materials.

Industry is migrating towards integration of heterogeneous functions with smaller form factor. FIG. 1 shows an embodiment of an exemplary system for Ultra Mobile Computing Applications to support wireless communication for mobility by integrating several standards, such as Bluetooth, WLAN and WIMAX, to support high speed computing. An implementation of such a system would require the integration of several new technologies, in addition to the integration of dissimilar die such as RF, digital, memory and sensors. To reduce system size, several semiconductor and system companies are pursuing three-dimensional stacking of die and packages in addition to planar thin film integration. The primary goal of the new technologies is to reduce size (area and height), increase performance and reduce cost. A major problem in such highly integrated systems is electromagnetic interference (EMI), which causes significant noise coupling between the digital and RF die. Both horizontal and vertical noise isolation is required to reduce electromagnetic interference.

EMI in such integrated systems can occur in two directions, namely along a horizontal direction through a substrate and along a vertical direction between stacked devices (die). A major source of coupling along the horizontal direction is through the power delivery network, which can be mitigated using electromagnetic bandgap (EBG) structures. This is discussed by in U.S. Pat. No. 7,215,301, entitled "Electromagnetic bandgap structure for isolation in mixed-signal systems," issue May 8, 2007.

EBG structures provide RF isolation levels of −100 dB or better in an area of 1 cm$^2$ with a bandwidth from 1 to 10 GHz, which is better than any other technology that has been reported so far. An example of an exemplary EBG structure and its response are respectively shown in FIGS. 2a and 2b. EBG structures depend upon the periodicity of a unit cell along a lateral direction to generate their bandgap response, as shown in FIGS. 2a and 2b. EBG structures in their present form, however, cannot be used to isolate stacked die or devices to minimize vertical noise coupling, due to their size. The vertical noise coupling between RF and digital die has been identified as a major bottleneck with regard to three-dimensional integration. Other approach is to reduce EMI noise by using active devices such as EMI filter chips.

It would be desirable to have simple thin films made of ferroelectric and ferromagnetic noise isolation structures that reduce electromagnetic interference and noise in integrated circuit devices and system architectures.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 2b illustrates the frequency response of the exemplary electronic bandgap structure shown in FIG. 2a;

DETAILED DESCRIPTION

Figure 1:
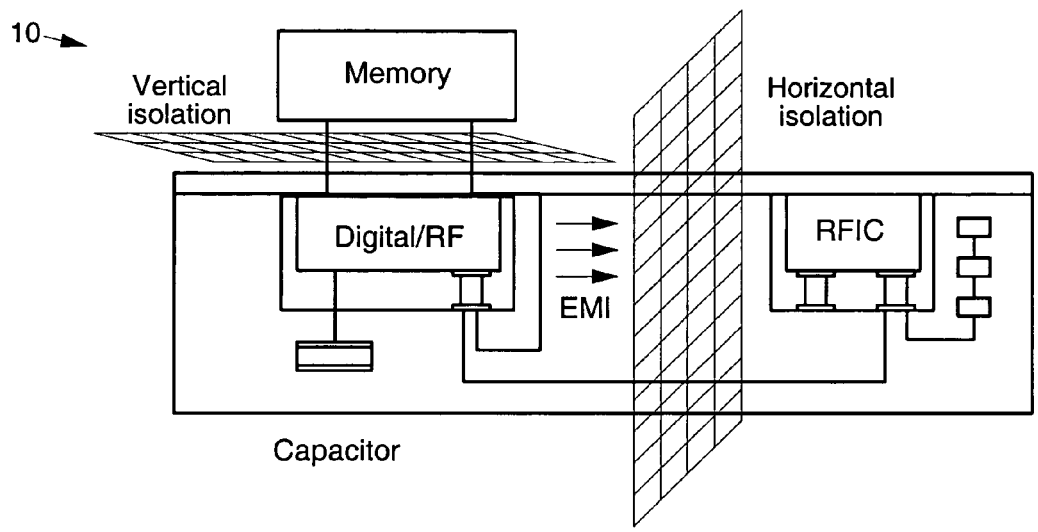
FIG. 1 illustrates an exemplary integrated system package requiring noise isolation.
Figure 2A:
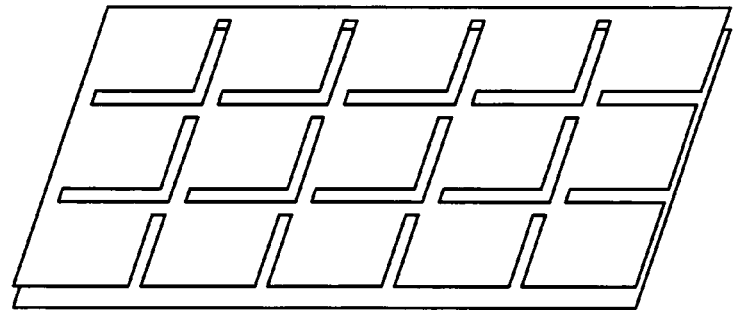
FIG. 2a illustrates an exemplary electronic bandgap structure.
Figure 2B:
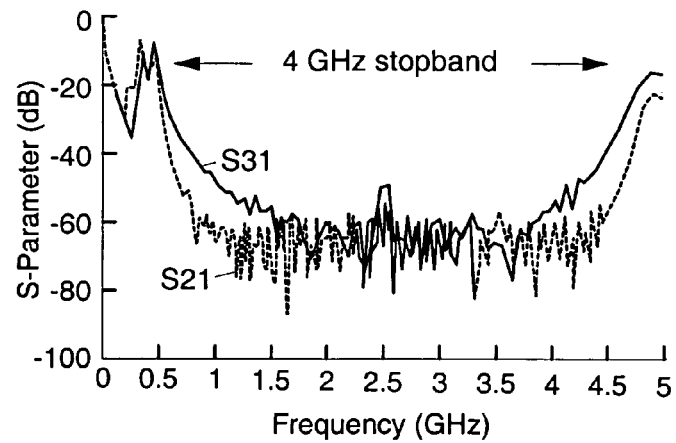
Figure 3:
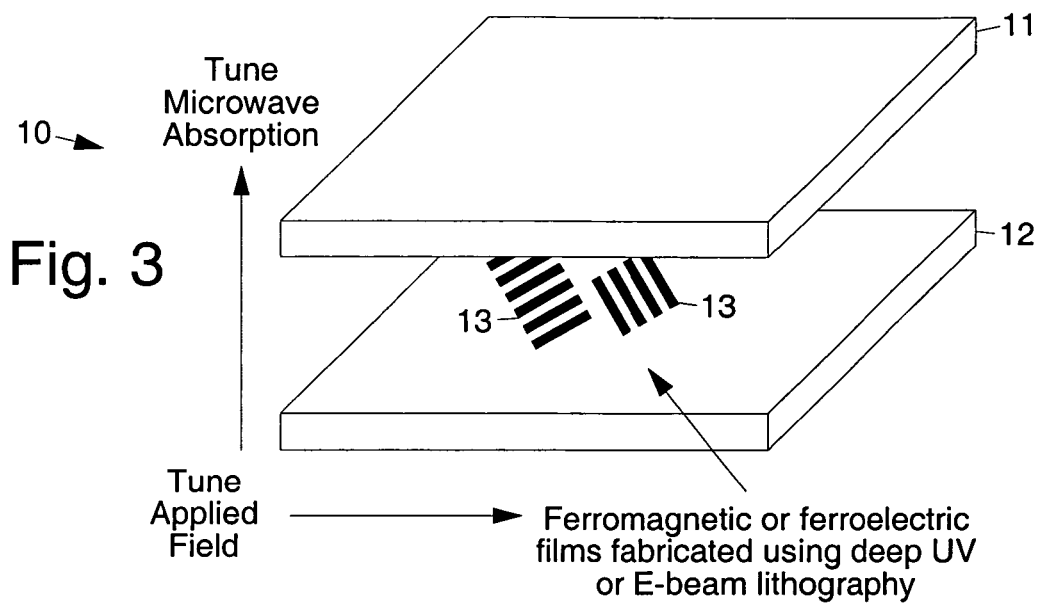
FIG. 3 illustrates exemplary magnetic films disposed between two vertically-stacked devices that provides for controllable noise absorption.

As is illustrated in FIG. 3, disclosed are thin film tunable ferroelectric and ferromagnetic structures 13 disposed in three-dimensional and two-dimensional electronic architectures or integrated circuit packages 10 between adjacent devices 11, 12 or components 11, 12 that provide improved noise isolation at selected frequencies. The thin film ferroelectric and ferromagnetic structures 13 may be patterned to improve their performance.

The vertical noise isolation structures 13 comprise vertical electronic bandgap structures 13, that embody ferroelectric or ferromagnetic thin film structures that absorb RF noise energy in the frequency range from 1 to 12 GHz, for example, a frequency band over which most consumer wireless applications function. FIG. 3 illustrates vertical isolation between stacked devices 11, 12 of a three-dimensional integrated circuit 10 using thin film noise absorption layers 13 or films 13. The thin film noise absorption layers 13 or films 13 comprise vertical electronic bandgap (VEBG) structures 13. The thickness of the vertical electronic bandgap structures 13 are in the micro to nanometer range and hence are ideally suited for three-dimensional integration.

The noise absorption layer 13 or film 13 may constitute alloy compositions of Ni, Fe, Co, Zn, Ta, and corresponding ferrites. The layer 13 or film 13 may be cosputtered with a desired alloy composition. The layer 13 or film 13 may be coplated to obtain a desired composition and orientation. The layer 13 or film 13 is preferably a perovskite-like crystal structure such as barium titanate or barium strontium titanate material.

In ferromagnetic films 13, the ferromagnetic resonance (FMR) frequency plays an important role in absorbing RF energy. The ferromagnetic resonance of the film 13 may be used as a loss generation mechanism whereby RF energy propagating vertically from a digital die 11 (device 11, for example) to an RF die 12 (device 12, for example) or between RF die 12 in a three-dimensional stack can be absorbed by the magnetic film 13 without the need for an external magnetic field. The ferromagnetic resonance frequency is controlled by the dimensions of the magnetic films 13 and hence can be varied depending on the frequency range over which isolation is required. In addition, vertical isolation over selective frequency bands can be achieved either by designing ferromagnetic film arrays or by applying external DC magnetic fields.

The vertical noise isolation structures 13 employ a unique technique for suppressing the vertical propagation of electromagnetic energy using magnetic or ferroelectric thin films and ferromagnetic arrays. The electron magnetic moment in a ferromagnet precesses about the direction of the magnetic field, and energy is absorbed strongly from the RF transverse field when the RF frequency is equal to the precession frequency. This is discussed by Charles E. Kittel, *Theory of ferromagnetic resonance absorption*, vol. 73, 2, January 1948, pp. 155-161.

Figure 4:
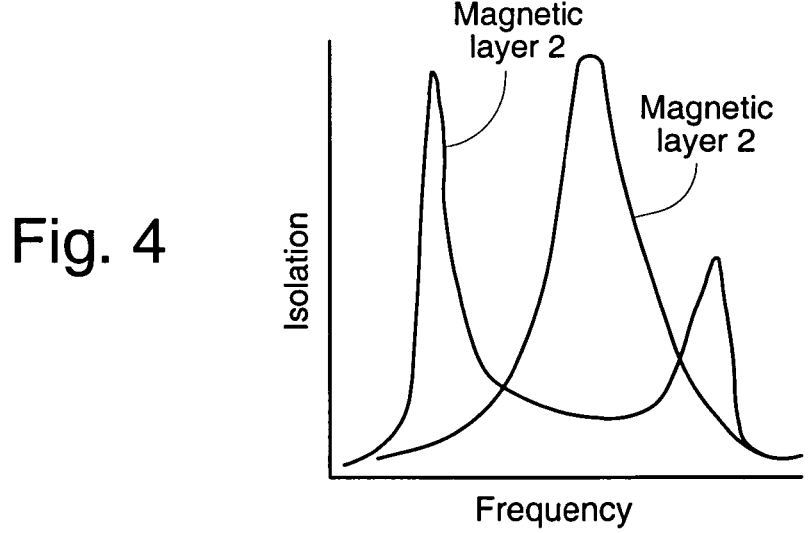
FIG. 4 is a graph showing absorption of electromagnetic energy as a function of frequency in magnetic materials.

FIG. 4 is a graph that shows absorption of electromagnetic energy as a function of frequency in magnetic materials. A transmitted microwave frequency shows a dip at the ferromagnetic resonance frequency due to the coupling of the microwave energy to the magnetic spin system. The transverse magnetic susceptibilities are very large because of the high magnetization in ferromagnetic moments. The strong exchange coupling between ferromagnetic electrons can lead to sharp resonance peaks. For an isotropic material, this resonance frequency is given by:

$$F_{res} = \frac{\gamma}{2\pi}\sqrt{H(H+M_s)}$$

where H is the applied field, $M_S$ is the saturation magnetization and g is the gyromagnetic ratio ($2.31\times10^8$ m/kAs). For films with a uniaxial anisotropy field $H_u$ along the direction of the applied bias field, the resonant frequency shifts and is given as:

$$F_{res} = \frac{\gamma}{2\pi}\sqrt{(H+H_u)(H+M_s+H_u)}.$$

Ferromagnetic resonance phenomenon is widely used for making crystal oscillators (ex. YIG tuned oscillators), circulators and proposed as potential solution for microwave filters and microwave absorption [3-5]. This is discussed by Ki Hyeon Kim, et al., in "RF Integrated Noise Suppressor Using Soft Magnetic Films," *IEEE Transactions on Magnetics* Vol. 40, No. 4, July 2004, Bijoy Kuanr, et al., in "Iron and Permalloy based magnetic monolithic tunable microwave devices," *Journal of Applied Physics*, Volume 93, Number 10, 15 May 2003, and Leszek M. Malkinski, et al., in "Microwave Absorption of Patterned Arrays of Nanosized Magnetic Stripes with Different Aspect Ratios," in *Journal of Applied Physics*, 101, 2007.

Figure 5A:
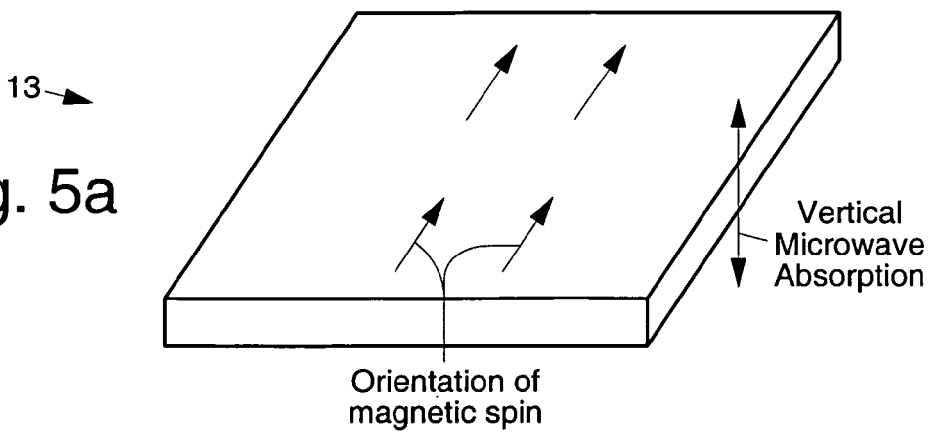
FIGS. 5a and 5b illustrate exemplary noise isolation structures that provide in-plane and out-of-plane adsorption, respectively.
Figure 5B:
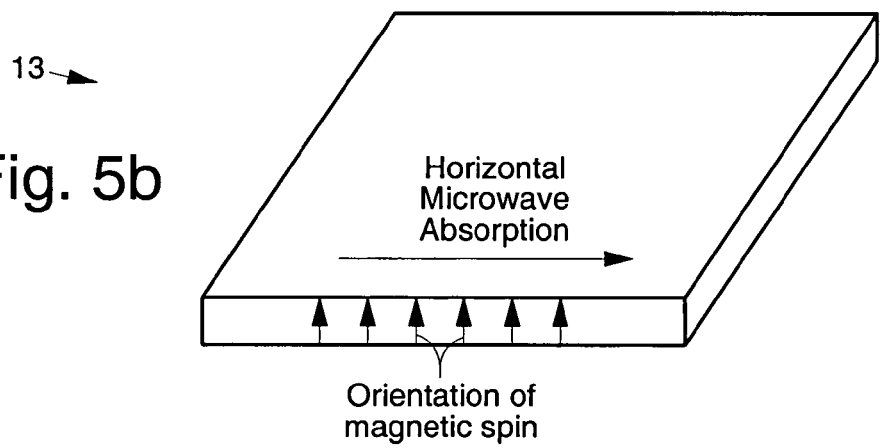
Figure 6:
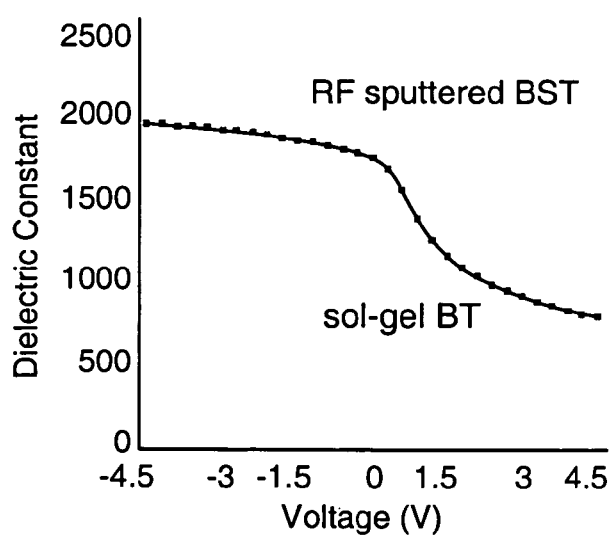
FIG. 6 is a graph showing dielectric constant versus voltage for an exemplary reduced-to-practice noise isolation structure.

Using the property of ferromagnetic resonance, the magnetic films 13 can be used to absorb RF energy in a direction that is orthogonal to the magnetization direction. This can enable vertical and even horizontal noise isolation in a 3D stack at specific frequencies. The absorption of RF energy at specific frequencies can be induced without the use of external fields or by applying an external DC magnetic field. Using this approach, the tuning of the absorption frequency can be achieved by changing the geometry of the magnetic film 13, by using ferromagnetic arrays or by changing the intensity of the external DC magnetic field. Since, the achieved vertical isolation is similar to a bandgap over a range of frequencies, this structure is referred to as a vertical electromagnetic bandgap (VEBG) structure 13. Another extension of this concept is the inclusion of the magnetic thin films 13 in EBG structures 13 that simultaneously suppresses electromagnetic coupling in both lateral and vertical directions. This is illustrated in FIGS. 5a and 5b, which respectively show horizontal and vertical isolation with oriented magnetic domains.

Several techniques are discussed below to control absorption and isolation characteristics of the magnetic films 13. These are to (1) control orientation and texture, (2) pattern magnetic arrays for specific resonance peaks, and (3) tune resonance peaks with external magnetic fields.

Control Orientation and Texture

Crystalline orientation or crystal texture leads to anisotropic properties in magnetic thin films 13 with high magnetic field strength. The orientation of the magnetic moments can be made in-plane or out-of-plane based on the film growth conditions and appropriate choice of the growth substrate. Textured films 13 of iron and permalloy can be grown on gallium arsenide (GaAs) without applying any magnetic field during growth. The anisotropy is purely growth-induced anisotropy. For growth of textured films 13 on BiCMOS and CMOS compatible silicon substrates, more innovative techniques based on electroplating under a strong external DC magnetic field may be used. By modifying plating or sputtering growth conditions, oriented films 13 with specific absorption characteristics can be obtained.

Pattern Magnetic Arrays for Specific Resonance Peaks

Arrays comprised of nano-sized stripes 13 (films 13) of magnetic alloys with different length-to-width ratios may be fabricated using sputtering, microscan nanolithography with an etch-back or lift-off process. These stripes 13 (films 13) have a thickness of 100-1000 nm, a width of 300 nm to 2000 nm, and different lengths ranging from 300 nm to 5000 nm, for example. The microwave absorption spectra of these films 13 may be controlled with the thin film materials, aspect ratio, orientation and spacing. By changing the aspect ratio of the magnetic stripes 13, the field orientation and spacing between them, predetermined noise absorption in multiple frequency bands may be achieved.

Tune the Resonance Peaks with External Fields

DC magnetic or electric field can also tune the absorption frequencies of the films 13 by applying required current densities around a coil. For highly oriented magnetic structures, a relatively small field may be used to obtain high magnetic strength when it is applied in the direction of magnetic alignment. To apply a field of about 100 Oe (8 kA/m), a current of 160 Amps is needed over a 2 cm perimeter length (for a 0.5 cm square coil). The current requirements may be lowered by reducing the diameter of the coil. The required field is much lower when the field is applied in the magnetization direction.

Thus, the electronic band gap (EBG) structure 10 may be embodied in a thin film ferroelectric structure that comprises a tunable barium strontium titanate (BST) thin film layer 13 disposed between power and ground planes, for example. The BST thin film layer 13 has a permittivity ranging from 1500-6000, for example, which miniaturizes the EBG structure 10 on the order of 40-75 times.

Preliminary test results using reduced-to-practice prototypes of the electronic bandgap structure 10 show that the dielectric constant of the BST thin film layer 15 can be tuned by a factor of 2.5-3 by applying 5 volts to a 1 micron thick film 13. This can tune the resonant frequency of the electronic band gap structure 13 by about 50 percent. The frequencies for isolation may be varied depending on the applied voltage.

The electronic band gap structure 10 may also be embodied in a thin film ferroelectric structure 13 comprising a thin ferromagnetic film 13. If the ferromagnetic film 13 is subjected to a static magnetic field and subjected to electromagnetic waves in a perpendicular direction, ferromagnetic resonance occurs at a frequency proportional to the strength of the static magnetic field. Maximum microwave power is absorbed at the resonant frequency. By designing and fabricating suitable magnetic thin films 13, tunable microwave absorption can occur and result in improved noise isolation in three-dimensional and two-dimensional integrated device architectures.

A prototype was developed and evaluated. An RF sputtering process was optimized for use with a BST target. Heat-treatment was performed at two different conditions. The thickness of the film 13 was controlled by controlling the RF power and the distance between the BST target and a copper foil substrate. As-deposited films 13 from RF sputtering show a capacitance density less than 50 nF/cm$^2$ and this is attributed to the amorphous phase of the films 13. Heat treatment makes the film 13 have higher capacitance density because of the crystallization of the film 13. It has been found that the capacitance density of BST films on copper foil with heat-treatment condition depends on the thickness of the film 13. Heat-treated films 13 having a thickness greater than 400 nm show a breakdown voltage higher than 10V. The present inventors have demonstrated RF sputtered thin films 13 on free-standing copper foil transferred to an organic substrate using a lamination process. A top electrode was deposited by sputtering copper. Barium titanate films 13 were patterned via photolithography and wet acid etching. Tunability data from a prototype film 13 is shown in FIGS. 5a and 5b, which illustrate peak absorption of microwave frequencies at the gyromagnetic resonance frequency.

Thus, ferroelectric and ferromagnetic noise isolation structures that reduce electromagnetic interference and noise in integrated circuit devices and system architectures have been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. Apparatus comprising:
a digital device and a radio frequency device that are vertically disposed relative to one another; and
a thin magnetic film layer disposed between the respective devices that isolates electromagnetic energy coupling from one device to another, wherein the thin magnetic film layer is tuned to a desired ferromagnetic resonance frequency by controlling the dimensions of the thin magnetic film layer wherein the magnetic film layer has an alloy composition that is controlled to tune the isolation characteristic to a desired frequency, wherein the magnetic film layer is patterned into a set of arrays with controlled spacing and orientation that induces specific noise isolation characteristics.

2. The apparatus recited in claim 1 wherein the magnetic film layer has a crystallographic orientation that is controlled to tune its isolation characteristics to a desired frequency.

3. The apparatus in claim 1, wherein an external DC magnetic field is applied at various angles to control the noise isolation characteristics of the magnetic arrays.

4. The apparatus recited in claim 1 wherein the magnetic film layer constitutes alloy compositions of Ni, Fe, Co, and corresponding ferrites.

5. The apparatus recited in claim 1 wherein the magnetic film layer is cosputtered with a desired alloy composition.

6. The apparatus recited in claim 1 wherein the magnetic layer is coplated to obtain a desired composition and orientation.

7. The apparatus recited in claim 1 wherein the absorption characteristics of the magnetic film layer are altered by applying a static magnetic field.

8. Apparatus comprising:
two radio frequency devices that are vertically disposed relative to one another; and
a thin magnetic film layer disposed between the respective devices that isolates electromagnetic energy coupling from one device to another, wherein the thin magnetic film layer is tuned to a desired ferromagnetic resonance frequency by controlling the dimensions of the thin magnetic film layer wherein the magnetic film layer is patterned into a set of arrays with controlled spacing and orientation that induces specific noise isolation characteristics.

9. The apparatus recited in claim 8, wherein the magnetic film layer has a crystallographic orientation that is controlled to tune its isolation characteristics to a desired frequency.

10. The apparatus recited in claim 8, wherein the magnetic film layer has an alloy composition that is controlled to tune the isolation characteristic to a desired frequency.

11. The apparatus in claim 8, wherein an external DC magnetic field is applied at various angles to control the noise isolation characteristics of the magnetic arrays.

12. The apparatus recited in claim 8, wherein the magnetic film layer constitutes alloy compositions of Ni, Fe, Co, and corresponding ferrites.

13. The apparatus recited in claim 8, wherein the magnetic film layer is cosputtered with a desired alloy composition.

14. The apparatus recited in claim 8, wherein the magnetic layer is coplated to obtain a desired composition and orientation.

15. The apparatus recited in claim 8, wherein the absorption characteristics of the magnetic film layer are altered by applying a static magnetic field.

* * * * *